(12) United States Patent
Shishido et al.

(10) Patent No.: US 6,555,233 B2
(45) Date of Patent: Apr. 29, 2003

(54) MASK FOR SPUTTERING

(75) Inventors: Akira Shishido, Tokyo-To (JP);
Atsutoshi Yamada, Tokyo-To (JP)

(73) Assignee: Dai Nippon Printing Co., Ltd. (JP)

( * ) Notice: Subject to any disclaimer, the term of this patent is extended or adjusted under 35 U.S.C. 154(b) by 0 days.

(21) Appl. No.: 09/970,809

(22) Filed: Oct. 5, 2001

(65) Prior Publication Data

US 2002/0011406 A1 Jan. 31, 2002

Related U.S. Application Data

(62) Division of application No. 09/717,389, filed on Nov. 22, 2000, now Pat. No. 6,325,902.

(30) Foreign Application Priority Data

Nov. 24, 1999 (JP) .............................................. 11-332568

(51) Int. Cl.[7] .............................................. B32B 17/06
(52) U.S. Cl. ...................... 428/432; 428/433; 428/702; 359/885; 359/892; 204/192.29; 204/192.26; 204/298.11
(58) Field of Search .................. 428/432, 433, 428/702; 359/885, 892; 204/192.29, 192.26, 298.11

(56) References Cited

FOREIGN PATENT DOCUMENTS

| JP | 63-219568 | 9/1988 |
|---|---|---|
| JP | 05-117839 | 5/1993 |
| JP | 06-088206 | 3/1994 |

*Primary Examiner*—Deborah Jones
*Assistant Examiner*—Andrew T Piziali
(74) *Attorney, Agent, or Firm*—Parkhurst & Wendel, L.L.P.

(57) ABSTRACT

In a sputtering process of forming a transparent electrode film (13) on a color filter (14), the dielectric breakdown of a peripheral portion of the color pattern film (10) due to abnormal discharge is prevented. A metal mask (8) has a mask body (8b) provided with openings (8a) having a shape corresponding to that of the color pattern films (10) formed on a glass substrate (9) Stepped portions (8d) are formed by recessing brim portions (8c) of the openings (8a) facing the color filters (14). Gaps (11) are formed between the mask body (8b) and peripheral portions of the color pattern films (10) of the color filters (14). The mask body (8b) is provided on the stepped portions (8d) with conductive projections (12). The conductive projections (12) come into electrical contact with black shading strips (10b) formed in the peripheral portions of the color pattern films (10) of the color filters (14).

1 Claim, 2 Drawing Sheets

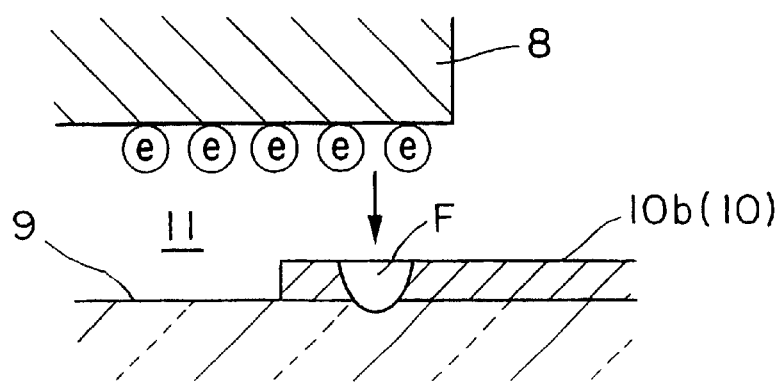
F I G. 3

MASK FOR SPUTTERING

This is a Division off application Ser. No. 09/717,389 filed Nov. 22, 2000, now allowed U.S. Pat. No. 6,325,902.

BACKGROUND OF THE INVENTION

1. Field of the Invention

The present invention relates to a color filter for a liquid crystal display or the like. More particularly, the present invention relates to a mask for sputtering to be used for forming a transparent electrode layer on a color filter by sputtering, a sputtering process, a color filter provided with a transparent electrode layer formed by the sputtering process using the mask for sputtering.

2. Description of the Related Art

A color filter fabricating method includes a chromium film forming process for forming a chromium film on a glass substrate by a vacuum evaporation method; a black shading layer forming process for forming a black shading layer of a striped pattern having stripes or a latticed pattern having crisscrossed stripes by coating the chromium film with a photoresist film, placing a photomask on the photoresist film, exposing the photoresist film through the photomask to light and developing the exposed photoresist film, etching the chromium film through the exposed photoresist film, and removing the exposed photoresist film; RGB color layer forming process for forming R, G and B color layers; and a transparent electrode forming process for forming a transparent electrode layer by forming an indium tin oxide film (ITO film) on the R, G and B color layers. The RGB color layer forming process includes the step of forming a first color layer by spreading a first coloring photosensitive material in a first color film over the black shading layer, placing a photomask on the first color film, exposing the first color film to light through the photomask and developing the exposed first color film, and steps of forming a second and a third color layer, similar to the step of forming the first color layer.

A sputtering method is used prevalently in the transparent electrode forming process because the sputtering method is capable of forming a sufficiently adhesive thin film of a uniform thickness at a comparatively low temperature in a short time. In an automated production line, a combination of a glass substrate provided with a black shading layer and the color layers, and a sputtering mask is fixedly held in a jig, and several tens of such jigs are carried into a sputtering apparatus, and the glass substrates held in the jigs are subjected to a sputtering process.

FIG. 2 shows a sputtering jig disclosed in JP-A No. 117839/1993 in an exploded perspective view. The sputtering jig 1 has a substrate holding plate 2 provided with an opening 2a, and a substrate fastening plate 5 connected to the substrate holding plate 2 by a hinge 3 so as to be turnable relative to the substrate holding plate 2. A plurality of magnets 6 are embedded in the substrate fastening plate 5. A plurality of guide pins 7 are arranged on the substrate holding plate 2 around the opening 2a. A mask 8 and a glass substrate 9 are set in place on the substrate holding plate 2 by setting the mask 8 and the glass substrate 9 in contact with the guide pins 7. After setting the mask 8 and the glass substrate 9 on the substrate holding plate 2, the substrate fastening plate 5 is turned relative to the substrate holding plate 2 to hold fixedly the mask 8 and the glass substrate 9 between the substrate holding plate 2 and the substrate fastening plate 5. The glass substrate 9 is provided with a plurality of color pattern films 10, and the mask 8 is provided with openings 8a of a shape corresponding to that of the color patterns 10 on the glass substrate 9. The mask 8 is formed of a heat-resistant ferromagnetic material capable of withstanding a high temperature on the order of 200° C.

In the jig 1, the mask 8 of a ferromagnetic material is attracted firmly to the substrate fastening plate 5 by the magnets 6 of the substrate fastening plate 5 so that the mask 8 is in close contact with the glass substrate 9. When the mask 8 and the glass substrate 9 thus firmly joined together are exposed to a high temperature on the order of 200° C. in the sputtering apparatus, thermal stresses are induced in the mask 8 and the glass substrate 9 due to difference in coefficient of thermal expansion between the mask 8 and the glass substrate 9. Consequently, peripheral portions (black shading strips 10b) of the color pattern films 10 formed on the glass substrate 9 are liable to be damaged, and liquid crystal displays provided with color filters thus fabricated are liable to be defective due to the leakage of light thrown by a backlight.

A sputtering jig is proposed to solve such a problem in JP-A No. 88206/1994. When this prior art sputtering jig is used, recesses are formed in brim portions of the openings 8a of the mask 8 (FIG. 2) facing the glass substrate 9 by etching so that clearances are secured between the mask 8 and the circumferences of the color pattern films 10 formed on the glass substrate 9 to prevent damaging peripheral portions of the color pattern films 10.

A sputtering apparatus that processes the glass substrate 9 held by the sputtering jig has a vacuum vessel filled with a gas. A negative voltage is applied to a target placed in the vacuum vessel to produce a plasma by ionizing the gas by electric discharge, and a transparent electrode layer is deposited on the color pattern films 10 by bombarding the target with ions of the plasma to cause the target sputter atoms from its bombarded surface. When a gap 11 is formed between the mask 8 and the glass substrate 9 as shown in FIG. 3, a relatively amount of electric charges is accumulated on the surface of the mask 8 due to secondary electron emission because the mask 8 and the glass substrate 9 are exposed to electric discharge. Therefore, abnormal electric discharge from the mask 8 to the glass substrate 9 occurs when the potential difference between the mask 8 and the glass substrate 9 increases to a certain level. Consequently, breaks E are formed in peripheral portions (black shading strips 10b) of the color pattern films 10 formed on the glass substrate 9 due to dielectric breakdown.

SUMMARY OF THE INVENTION

The present invention has been made in view of those problems and it is therefore an object of the present invention to provide a sputtering mask, a color filter and a sputtering method used for forming a transparent electrode layer on a color filter by sputtering, capable of preventing the formation of breaks in a peripheral portion of a color pattern film due to dielectric breakdown caused by abnormal discharge.

According to a first aspect of the present invention, a sputtering mask for forming a transparent electrode film on a color filter by sputtering, comprises: a mask body provided with an opening having a shape corresponding to that of a color pattern film of the color filter, and a gap forming portion formed by recessing a brim portion of the opening facing the color filter; and a conductive part formed in the gap forming portion so as to be in electrical contact with a conductive shading strip formed in a peripheral portion of the color pattern film. Preferably, the gap forming portion is a stepped portion extending along the brim portion of the opening of the mask body. Also, it is preferred that the conductive part is a conductive projection projecting from the gap forming portion of the mask body.

According to a second aspect of the present invention, a color filter on which a transparent electrode layer is formed by sputtering using a sputtering mask, comprises a glass substrate; a color pattern film formed on the glass substrate; and a conductive part formed on a conductive shading strip formed in a peripheral portion of the color pattern film so as to be in electrical contact with the sputtering mask. Preferably, the conductive part is a conductive projection projecting from the conductive shading strip.

According to a third aspect of the present invention, a sputtering method of forming a transparent electrode film on a color filter by sputtering, comprises the steps of: preparing a sputtering mask provided with an opening having a shape corresponding to that of a color pattern film of the color filter; placing the sputtering mask on the color filter so that the opening of the sputtering mask coincide with the color pattern film and a gap is formed between a brim portion of the opening of the sputtering mask and a peripheral portion of the color pattern film of the color filter; and forming a transparent electrode layer by sputtering using the sputtering mask on the color filter with the sputtering mask electrically connected to a conductive shading strip formed in the peripheral portion of the color pattern film by a conductive part.

According to the present invention, the sputtering mask and the color filter (glass substrate) are kept in electrical contact with each other by the conductive part and the conductive shading layer. Therefore, there is no potential difference between the sputtering mask and the color filter (glass substrate) even if the sputtering mask and the color filter are charged, so that it is possible to prevent the formation of breaks in the peripheral portion of the color pattern due to dielectric breakdown caused by abnormal discharge.

BRIEF DESCRIPTION OF THE DRAWINGS

FIGS. 1A to 1C are views of assistance in explaining a sputtering mask in a preferred embodiment of the present invention, in which FIG. 1A is a plan view of the sputtering mask, FIG. 1B is an enlarged plan view of a portion 1B of the sputtering mask shown in FIG. 1A as superposed on a color filter in process, and FIG. 1C is a sectional view taken on line IC—IC in FIG. 1B;

FIG. 3 is a view of assistance in explaining a problem to be solved by the present invention.

DESCRIPTION OF THE PREFERRED EMBODIMENTS

Figure 1A:
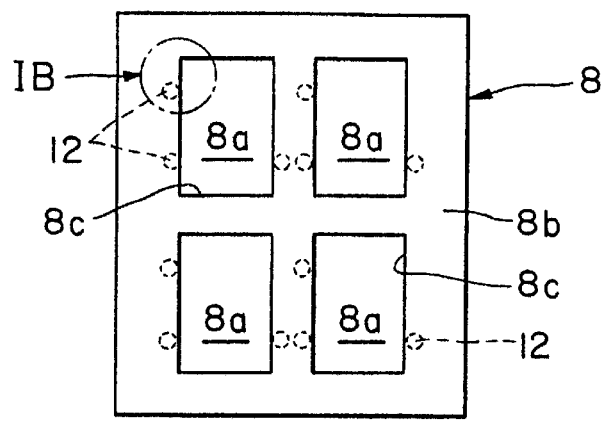

Referring to FIG. 1A, a metal mask (a sputtering mask) 8 in a preferred embodiment of the present invention has a mask body 8b provided with a plurality of openings 8a. The mask body 8b is formed of a heat-resistant ferromagnetic material capable of withstanding high temperatures on the order of 200° C., such as a nickel-iron alloy. Preferably, the mask body 8b is formed of an alloy having a coefficient of thermal expansion nearly equal to that of a glass substrate 9, such as a stainless steel (SUS402, JIS). More preferably, the mask body 8b is formed of an alloy containing 42% nickel.

The metal mask 8 is used for forming transparent electrode layers 13 by sputtering on color filters 14, respectively. As shown in FIG. 1C, each of the openings 8a of the mask body 8b has a shape corresponding to that a color pattern film 10 of each color filter 14.

Figure 1B:
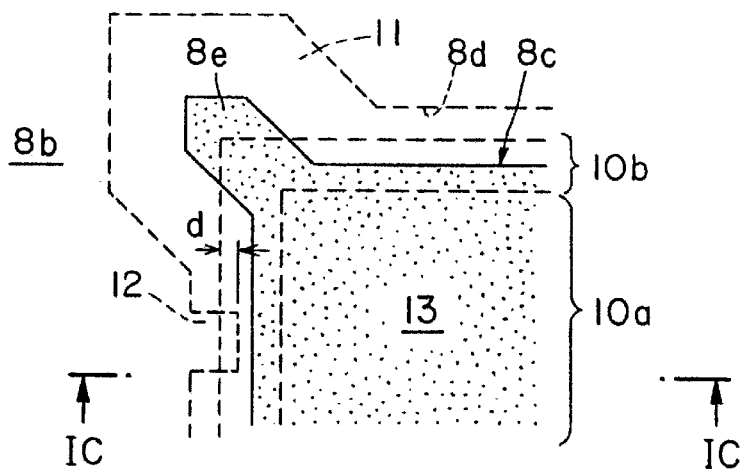
Figure 1C:
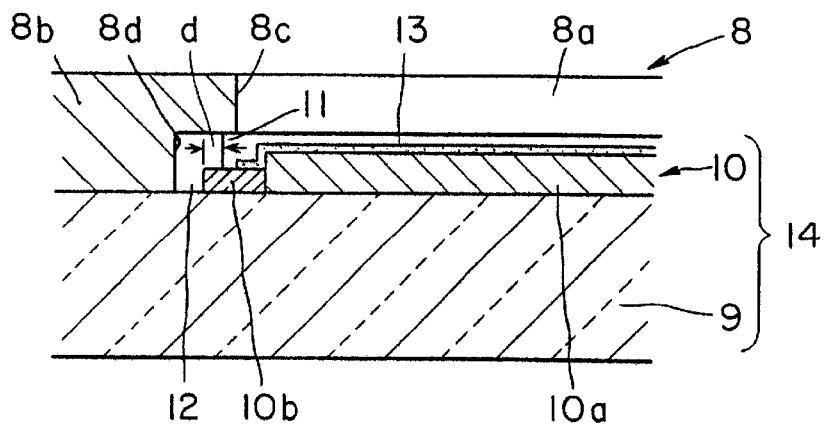

As shown in FIGS. 1B and 1C, the color filter 14 includes a glass substrate 9 and the color pattern film 10. The color pattern film 10 has a latticed pattern of black shading strips 10b and a color layer 10a surrounded by the latticed black shading strips 10b. In FIGS. 1B and 1C, only a portion of the black shading strips 10b in a peripheral portion of the color pattern film 10, and only one of the color layers 10a in the same peripheral portion of the color pattern film 10 are shown. The black shading strips 10b are formed of a conductive material, such as chromium.

As shown in FIGS. 1B and 1C, each opening 8a of the mask body 8b is formed so that the brim portion 8c thereof covers about half the width of the black shading strips 10b surrounding the color layer 10a of the color pattern film 10 of the color filter 14. As shown in FIG. 1B, a projection 8e, i.e., a terminal, is formed in a corner of each opening 8a of the mask body 8b. When the metal mask 8 thus formed is used for depositing an indium tin oxide film (ITO film) on the color filter 14 by sputtering, a transparent electrode layer 13 of a shape represented by a shaded area in FIG. 1B is formed.

Stepped portions (gap forming portions) 8d are formed in the brim portion 8c of each opening 8a of the mask body 8b, facing the color filter 14 to form a gap 11 between the mask body 8b and peripheral portions of the color pattern film 10. The stepped portions 8d of the mask body 8b can be formed by half-etching the brim portions 8c of the openings 8a.

As shown in FIGS. 1A and 1B, the stepped portions 8d of the mask body 8b are provided with conductive projections 12 formed so as to overlap and to be in electrical contact with the black shading strips 10b. The width d of portions of the conductive projections 12 overlapping the black shading strips 10b is on the order of 0.2 mm.

The conductive projections 12 are formed by half-etching the brim portions 8c of the openings 8a of the mask body 8b excluding portions corresponding to the conductive projections 12 when forming the stepped portions 8d. The conductive projections 12 may be formed by other methods.

Although the metal mask 8 may be provided with at least one conductive projection 12, it is preferable to form the plurality of conductive projections 12 (three conductive projections 12 in FIG. 1A) around each of the openings 8a of the mask body 8b in an arrangement as shown in FIG. 1A, because the width d of the portions of the conductive projections 12 overlapping the black shading strips 10b is as small as about 0.2 mm and hence it is possible that the conductive projections 12 cannot be satisfactorily in electrical contact with the black shading strips 10b if errors in the position of the black shading strips 10b is, for example on the order of 0.5 mm. However, when the plurality of conductive projections 12 are arranged as shown in FIG. 1A, some of the conductive projections 12 can be surely in electrical contact with some of the black shading strips 10b even if the black shading strips 10b are dislocated linearly or angularly.

A sputtering method of forming the transparent electrode layer 13 on the color filter 14 that uses the metal mask 8 will be described hereinafter.

Figure 2:
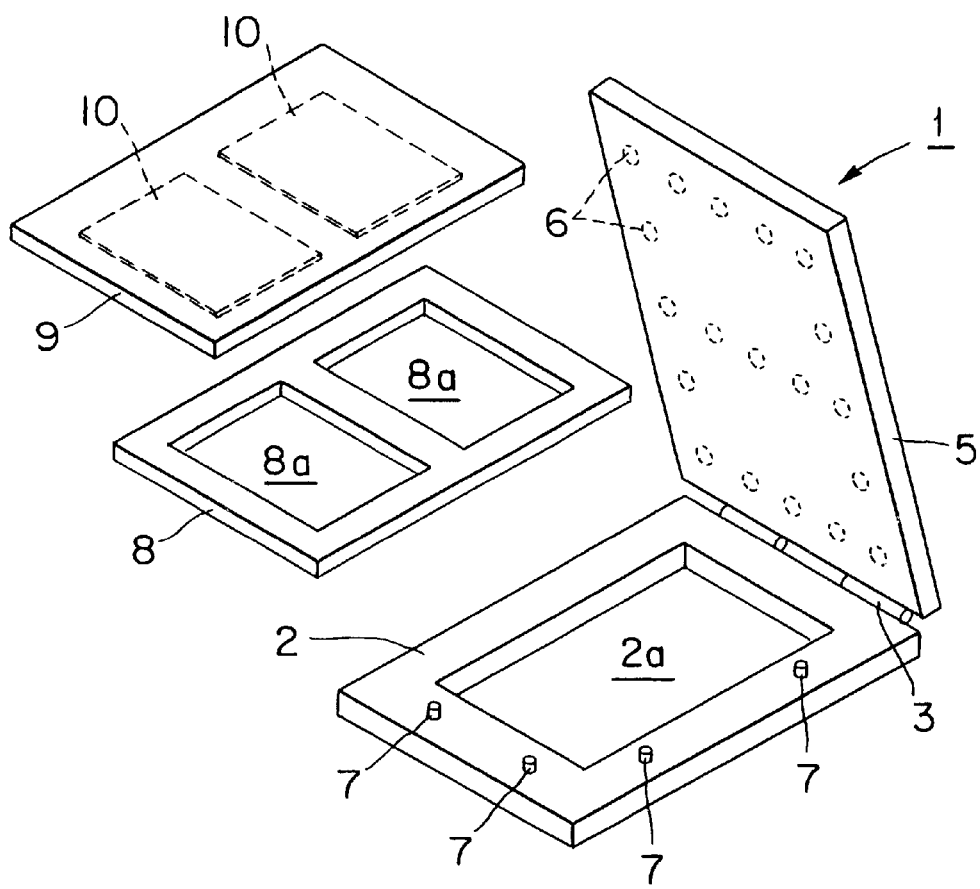
FIG. 2 is an exploded perspective view of a sputtering jig.

The metal mask 8 provided with the plurality openings 8a of a shape corresponding to that of the color pattern film 10 is prepared. The metal mask 8 is placed on the color filter 14 by using the sputtering jig 1 shown in FIG. 2. The sputtering jig 1 has the substrate holding plate 2 provided with the opening 2a, and the substrate fastening plate 5 connected to the substrate holding plate 2 by the hinge 3 so as to be turnable relative to the substrate holding plate 2. The plurality of magnets 6 are embedded in the substrate fastening plate 5.

More concretely, the mask 8 and the color filter 14 (the glass substrate 9) are set in place on the substrate holding plate 2 by setting the mask 8 and the color filter 14 in contact with the guide pins 7 arranged around the opening 2a of the substrate holding plate 2 of the sputtering jig 1. After setting the mask 8 and the color filter 14 on the substrate holding plate 2, the substrate fastening plate 5 is turned relative to the substrate holding plate 2 to hold fixedly the mask 8 and the color filter 14 between the substrate holding plate 2 and the substrate fastening plate 5. In this state, the color pattern films 10 of the color filter 14 coincide with the openings 8a of the metal mask 8, respectively. The metal mask 8 is attracted by the magnets 6 of the substrate fastening plate 5, so that the metal mask 8 is pressed firmly against and held in close contact with the color filter 14. The gap 11 is formed between the metal mask 8 and the peripheral portions (black shading strips 10b) of the color pattern film 10 of the color filter 14 by the stepped portion 8d formed in the brim portion 8c of each opening 8a of the metal mask 8, and the metal mask 8 is connected electrically to the peripheral portions (black shading strips 10b) of the color pattern films 10 of the color filter 14 by the conductive projections 12. The metal mask 8 and the color filter 14 may be provided with locating holes at positions corresponding to the guide pins 7 to locate the metal mask 8 and the color filter 14 accurately on the substrate holding plate 2.

The color filter 14 held by the jig 1 with the black shading strips 10b of the color pattern films 10 of the color filter 14 electrically connected to the conductive projections 12 is placed in a processing vessel of a sputtering apparatus and an indium tin oxide film (ITO film) is deposited on the color filter 14 through the metal mask 8 to form the transparent electrode layer 13.

Since the metal mask 8 and the glass substrate 9 of the color filter 14 are connected electrically by keeping the conductive projections 12 in contact with the black shading strips 10b, any potential difference is not produced between the metal mask 8 and the glass substrate 9 of the color filter 14 due to the accumulation of charges. Therefore, it is possible to prevent the formation of breaks in the black shading strips 10b of the color pattern film 10 due to dielectric breakdown caused by abnormal discharge.

Although the invention has been described in its preferred embodiment, the present invention is not limited thereto in its practical application and various changes and variations are possible therein. For example, conductive projections may be formed on the color filter 14 instead of the conductive projections formed on the metal mask 8. More concretely, conductive projections may be formed on the black shading strips 10b contiguous with the peripheries of the color pattern film 10 by a film forming process for forming a film on the black shading strips 10b. It is preferable that the conductive projections are formed at least at three positions in the peripheral portion of each color pattern film 10.

What is claimed is:

1. A color filter on which a transparent electrode film is formed by sputtering using a sputtering mask, said color filter comprising:

a glass substrate;

a color pattern film located on the glass substrate;

a conductive shading strip located in a peripheral portion of the color pattern film for electrical contact with a sputtering mask; and a conductive projection projecting from the conductive shading strip.

\* \* \* \* \*